United States Patent
Lee et al.

(10) Patent No.: US 6,248,619 B1
(45) Date of Patent: Jun. 19, 2001

(54) METHOD OF MANUFACTURING A SEMICONDUCTOR DEVICE

(75) Inventors: Dong Ho Lee, Seoul; Seung Woo Jin, Kyungki-Do, both of (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/325,344

(22) Filed: Jun. 4, 1999

(30) Foreign Application Priority Data

Jun. 5, 1998 (KR) .................................. 98-20862

(51) Int. Cl.$^7$ ............................................. H01L 21/8238
(52) U.S. Cl. ........................... 438/200; 438/217; 438/228
(58) Field of Search ........................................ 438/200, 217, 438/227, 228, 289, 290, 291

(56) References Cited

U.S. PATENT DOCUMENTS

| | | | |
|---|---|---|---|
| 4,902,636 | 2/1990 | Akiyama et al. | 437/45 |
| 5,238,860 | 8/1993 | Sawada et al. | 437/47 |
| 5,260,226 | 11/1993 | Sawada et al. | 437/29 |
| 5,262,339 | 11/1993 | Mori et al. | 437/41 |
| 5,397,734 | 3/1995 | Iguchi et al. | 437/70 |
| 5,406,105 | 4/1995 | Lee | 257/355 |
| 5,604,150 | 2/1997 | Mehrad | 437/70 |
| 5,668,024 | 9/1997 | Tsai et al. | 438/199 |
| 5,712,178 | 1/1998 | Cho et al. | 437/43 |
| 5,776,807 | 7/1998 | Ronkainen et al. | 438/202 |
| 5,856,003 | 1/1999 | Chiu | 438/362 |
| 5,989,949 | * 11/1999 | Kim et al. | 438/241 |

FOREIGN PATENT DOCUMENTS

| | | |
|---|---|---|
| 63-116470 | 5/1988 | (JP) . |
| 7-183393 | 7/1995 | (JP) . |
| 7-273213 | 10/1995 | (JP) . |
| 8-191107 | 7/1996 | (JP) . |
| 9-129763 | 5/1997 | (JP) . |
| 10-74845 | 3/1998 | (JP) . |
| 10-199993 | 7/1998 | (JP) . |

* cited by examiner

*Primary Examiner*—Chandra Chaudhari
(74) *Attorney, Agent, or Firm*—Pennie & Edmonds LLP

(57) ABSTRACT

The president invention discloses a method of manufacturing a semiconductor device, comprising the steps of: defining a cell region for an NMOS element and a peripheral circuit region for NMOS and PMOS elements on a semiconductor substrate; forming a sacrifice oxide film and an ion barrier oxide film on the entire structure after the defining process; performing ion injection process on the cell region and the peripheral circuit region, so that a low concentration impurity injection region therein is formed; removing the ion barrier oxide film formed on the cell region and the peripheral circuit region; performing ion injection process on selected regions of the cell region and the peripheral circuit region; injecting ions for adjusting a threshold voltage into selected regions of the cell region and the peripheral circuit region; performing ion injection process on the low concentration impurity regions of the cell region and the peripheral circuit region, so that R-well region and a P-well region are formed, respectively; removing the ion barrier oxide film on the peripheral circuit region; and performing ion injection process for adjusting the threshold voltage on the cell region and the peripheral circuit region.

14 Claims, 2 Drawing Sheets

METHOD OF MANUFACTURING A SEMICONDUCTOR DEVICE

BACKGROUND OF THE INVENTION

1. Field of the Invention

The invention relates generally to a method of manufacturing a semiconductor device, and more particularly to a method of manufacturing a semiconductor device by which a device having a reliable triple well structure can be manufactured by independently adjusting electrical characteristic of respective MOSFETs without an additional mask process, when performing ion implantation process for adjusting the threshold voltage of a transistor which will be formed on a peripheral circuit region and for adjusting the threshold voltage of a transistor which will be formed on a cell region.

2. Description of the Prior Art

A device having the triple well structure has an advantage that MOSFETs having independently different substrate bias from each other can be manufactured by differentiating the well concentration of a P-well, an isolated P-well (R-well) etc. However, in order for the device to have these electrical characteristic of MOSFETs, it additionally requires a process of forming wells corresponding to the respective MOSFET characteristics and a process of controlling a threshold voltage (hereinafter called Vt) to obtain the threshold voltage Vt.

In forming a conventional triple well, ions are implanted into the cell regions and the peripheral circuit regions, on which a NMOS will be formed, so as to adjust the threshold voltage Vt thereof after the N-channel Vt mask process. Then, more than a two-step photolithography process and an ion implantation process are performed to adjust the threshold voltage Vt in the cell region on which the NMOS will be formed, as well as that in the peripheral circuit regions on which a PMOS will be formed, after the P-channel Vt mask process. Also, if respective threshold voltages Vt are adjusted using these processes, the threshold voltages Vt in the peripheral circuit regions on which both the PMOS and NMOS will be formed and in the cell region on which the NMOS will be formed, are organically varied to each other during respective ion implantation process. In other words, the ion implantation process for adjusting the threshold voltage Vt in the peripheral circuit regions on which the NMOS will be formed, will affect the threshold voltage Vt in the cell region on which the NMOS will be formed, while the ion implantation process for adjusting the threshold voltage Vt in the peripheral circuit regions on which the PMOS will be formed, will affect the threshold voltage Vt in the cell region on which the NMOS will be formed, thereby making it difficult to independently adjust the threshold voltages of respective MOSFETs. Thus, the conventional method has a disadvantage that it necessarily requires separate photolithography process. As a result, a low production rate is resulting since it requires an additional mask process.

SUMMARY OF THE INVENTION

It is therefore an object of the present invention to provide a method of manufacturing a semiconductor device by which electrical characteristic of respective MOSFETs are independently adjusted to form a device having a reliable triple well structure without an additional mask process, when performing an ion implantation process for adjusting the threshold voltage in a transistor to be formed on the peripheral regions and in a transistor to be formed on a cell region.

In order to accomplish the above object, the method of manufacturing a semiconductor device comprises the steps of establishing, in a semiconductor device, a cell region in which an NMOS will be formed and a peripheral circuit region in which NMOS and PMOS will be formed and then forming a sacrifice oxide film and an ion barrier oxide film on the entire structure; performing ion injection process on the cell region in which the NMOS will be formed and the peripheral circuit region in which the PMOS will be formed, thereby to form a low concentration impurity injection region; sequentially removing said ion barrier oxide film formed on the cell region in which the NMOS will be formed and the peripheral circuit region in which the PMOS will be formed, performing ion injection process on selected regions of the cell region in which the low concentration impurity injection region is formed and the NMOS will be formed and on the peripheral circuit region in which the PMOS will be formed and injecting threshold voltage adjust ions into them; performing ion injection process on said low concentration impurity regions of the cell region in which the NMOS will be formed and on the peripheral circuit region in which the NMOS will be formed, thereby to form a R-well region and a P-well region, respectively; and removing said ion barrier oxide film on the peripheral circuit region in which the NMOS will be formed and then performing the threshold voltage adjust ion injection process on the cell region in which the NMOS will be formed and the peripheral circuit region in which the NMOS will be formed.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
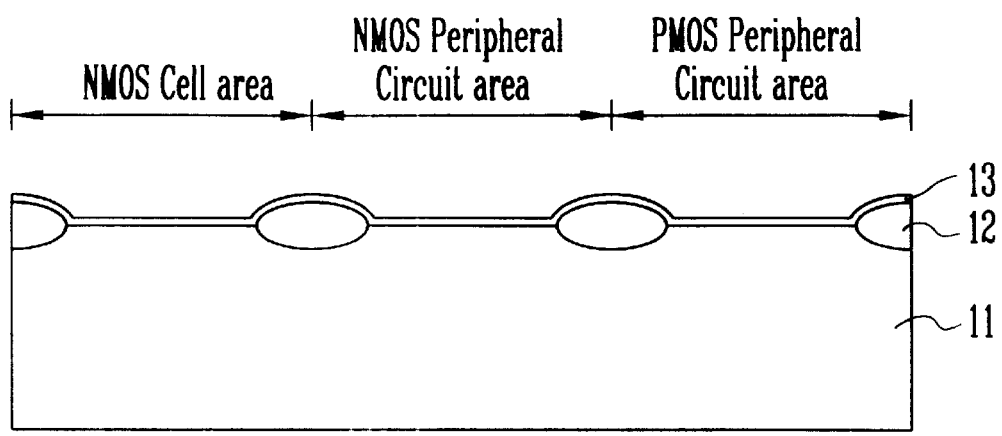
FIGS. 1A through 1E are sectional views of the device for illustrating the method of manufacturing the semiconductor device according to one embodiment of the present invention.

The present invention will be described in detail by way of a preferred embodiment with reference to accompanying drawings, in which like reference numerals are used to identify the same or similar parts.

Figure 1B:
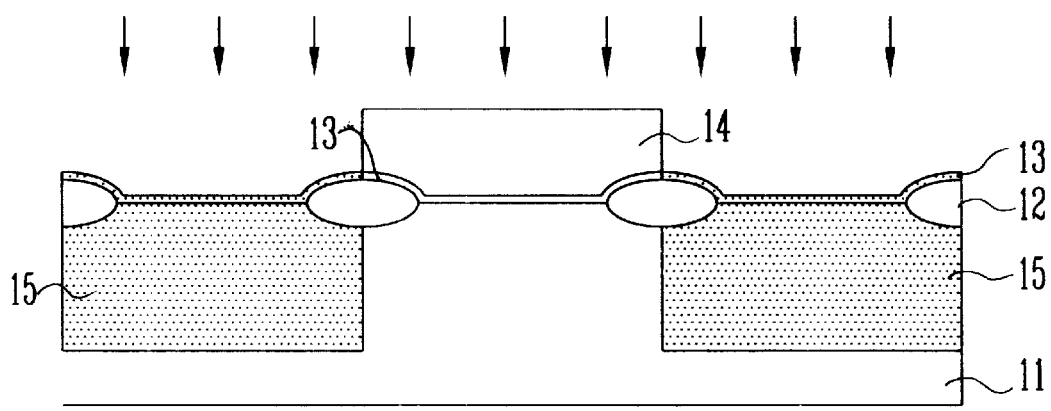
Figure 1C:
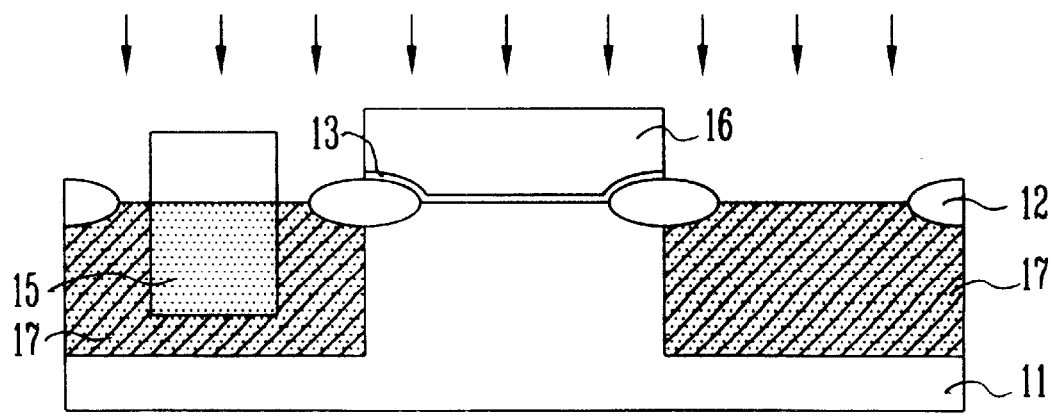

FIGS. 1A through 1C are sectional views of the device for illustrating the method of manufacturing the semiconductor device according to one embodiment of the present invention, by which the NMOS transistor in the cell region, and the NMOS and PMOS transistors in the peripheral regions are formed respectively.

Referring now to FIG. 1A, a field oxide film 12 for separating respective regions is formed on the semiconductor substrate 11. After a sacrifice oxide film (not shown) is formed on the entire structure using thermal oxidization method, an oxide film 13 is formed on it.

The oxide film 13 is formed using USG (Undoped Silicate Glass) or PSG (Phosphorus Silicate Glass), which not only prevents channelling upon ion implantation process, but also serves as a selective ion barrier upon ion implantation process for adjusting the threshold voltage Vt, both of which will be performed later.

Referring to FIG. 1B, a first photosensitive film is applied on the entire structure and then patterned to form a first photosensitive pattern 14 on the oxide film 13 in the peripheral circuit region on which the NMOS will be formed. Then, phosphorus ions are implanted using the first photosensitive film 14 remaining at the peripheral circuit region on which the NMOS will be formed as a mask, thus forming a low concentration impurity implantation region 15 within the semiconductor region 11 in the peripheral circuit region on which the PMOS will be formed and also in the cell region on which the NMOS will be formed.

At this time, the oxide film 13 of the cell region in which the NMOS will be formed and of the peripheral circuit region on which the PMOS will be formed, which are exposed by patterning the first photosensitive film, is caused to generate bombed defects upon a high energy ion injection. Upon an ion injection, it is phosphorous silicate glassed (PSG) due to phosphorous ions. Therefore, as the oxide film into which ions are not injected by means of the first photosensitive film pattern 14 has a low etching rate compared to the oxide film into which ions are injected, when performing a subsequent process of removing the patterns of the first photosensitive film, the oxide films into which ions are not injected are remained, while the oxide films into which ions are injected are removed.

Referring now to FIG. 1C, when removing the first photosensitive film pattern 14, the oxide films into which ions are not injected are remained and the oxide films into which ions are injected are removed by means of the above-mentioned principle. A second photosensitive film is applied on the entire structure and then patterned to form a second photosensitive film pattern 16. At this time, in the cell region in which the NMOS will be formed, the size of the second photosensitive pattern 16 is formed smaller than that of the low concentration impurity injection region 15, while in the peripheral circuit region in which the NMOS will be formed, it is formed to have a same pattern as the remained oxide film 13. Then, the ion injection process for simultaneously performing two processes of forming a well region using the second photosensitive film pattern 16 as a mask and of adjusting the P-channel threshold voltage is performed. With this process, some of the low concentration impurity injection region 15 formed in the cell region in which the NMOS will be formed, become a high concentration impurity region, that is a N-well region 17. Also some of the low concentration impurity injection region 15 formed in the peripheral circuit region in which the PMOS will be formed, become a high concentration impurity region, that is a N-well region 17. However, the low concentration impurity region remaining in the cell region becomes a R-well region.

Figure 1D:
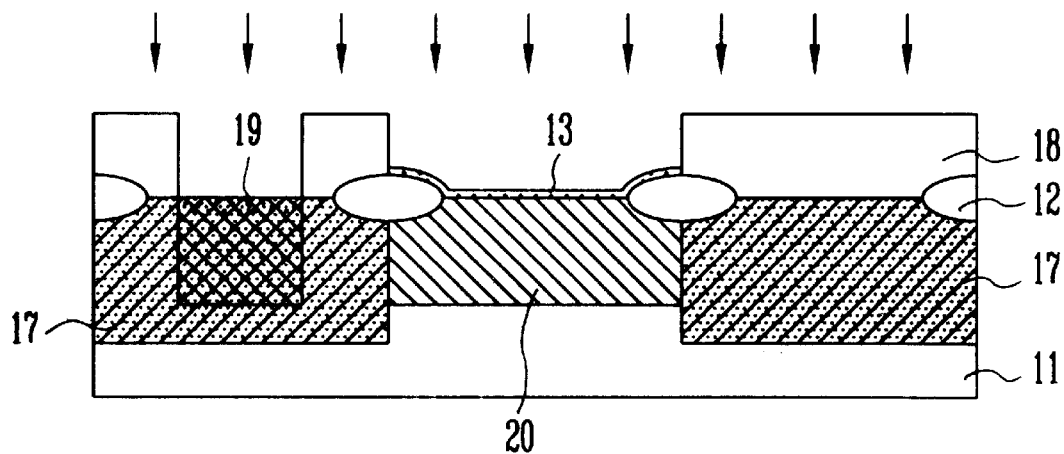

Referring now to FIG. 1D, after the second photosensitive film pattern 16 is removed, a third photosensitive film is applied on the entire structure and then patterned. A third photosensitive film pattern 18 is formed through a method opposite to that of forming the second photosensitive film pattern 16. More particularly, the portion in which the second photosensitive film pattern 16 was formed, is exposed form the cell region in which the NMOS will be formed, while the third photosensitive film pattern 18 is formed at the portion in which the second photosensitive film pattern 16 was not formed. In addition, the portion in which the NMOS will be formed among the peripheral circuit regions is opened to expose the oxide film 13, and the third photosensitive film pattern 18 is formed at the portion in which the PMOS will be formed.

A R-well region 19 is formed at the low concentration impurity region of the cell region in which the NMOS will be formed by performing ion injection process using the third photosensitive film pattern 18 as a mask, and a P-well region 20 is formed on the semiconductor substrate 11 of the peripheral circuit region in which the NMOS will be formed. Then, ions are injected into both the cell region in which the NMOS will be formed and the peripheral circuit region in which the NMOS will be formed so as to adjust their threshold voltages Vt.

At this time, ions for adjusting the threshold voltage Vt are not injected into the P-well region 20 of the peripheral circuit region in which the NMOS will be formed, but injected into only the R-well region 19 formed in the cell region. In other words, the P-well region 17 of the peripheral circuit region in which the NMOS will be formed and the R-well region 19 of the cell region in which the NMOS will be formed may be formed by ion injection process using the third photosensitive film pattern 18 as a mask. Also, ions for adjusting the threshold voltage Vt are injected only into the cell region in which the NMOS will be formed, but the oxide film 13 formed on the peripheral circuit region in which the NMOS will be formed prevents the ions from being injected thereto. Thus, the doping concentration of the ions for adjusting the threshold voltage Vt to be injected into the cell region in which the NMOS will be formed and the peripheral circuit region in which the NMOS will be formed, can be easily adjusted.

Figure 1E:
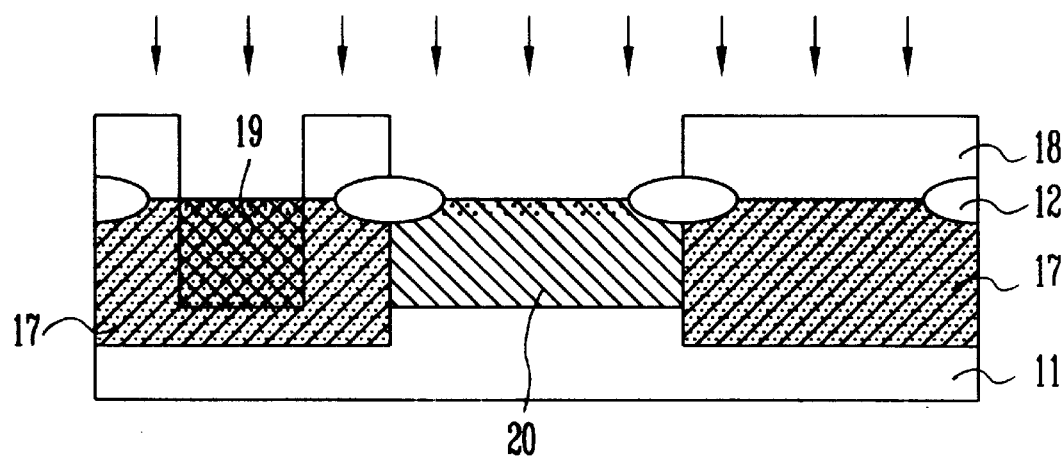

Referring to FIG. 1E, after the oxide film 13 on the peripheral circuit region in which the NMOS will be formed is removed by over-etching process, ion injection process for adjusting the threshold voltage Vt is performed on the cell rein in which NMOS will be formed and the peripheral circuit region in which the NMOS will be formed again.

When etching the oxide film 13, the thickness of the third photosensitive film pattern 18 can be decreased. However, since the photosensitive film used to inject high energy ions has the thickness of 2.5 $\mu$m, which is thicker more than 1.5 $\mu$m than that of the existing photosensitive film used for ions injection, it does not pose any problem of ion barrier function in case of an ion energy below 50 KeV that is an ion injection energy for adjusting the threshold voltage Vt.

Also, as the oxide film 13 for serving as an ion barrier for the peripheral circuit region in which the NMOS will be formed is removed by over-etching, ions for adjusting the threshold voltage Vt can be injected into the cell region in which a secondary NMOS will be formed and the peripheral circuit region in which a secondary NMOS will be formed. At this time, not only the concentration of the threshold voltage Vt of the peripheral circuit region in which the NMOS will be formed but also the concentration of the threshold voltage Vt of the cell region in which the NMOS will be formed by injecting remaining ions for adjusting the threshold voltage Vt of the cell region and of the peripheral circuit region in which the NMOS was formed, can be adjusted.

With this process, in a triple well structure, as the concentration of the threshold voltage Vt and the well regions of the cell region in which the NMOS will be formed and of the peripheral circuit region in which the NMOS and PMOS will be formed, can be adjusted, the method according to the present invention can adjust independently electrical characteristics of respective MOSFETs since it does not require an additional mask process.

As mentioned above, the method according to the present invention can not only prevent channelling since the ion injection process is performed after formation of the field oxide film and then deposition of the oxide film, but also make them serve as selective ion barrier oxide films during the ion injection process for adjusting the threshold voltage Vt, thus making it possible to omit an additional mask process for injecting the threshold voltage adjustment ions by adjusting independently the characteristics of the transistors which will be formed at the cell and peripheral circuit regions upon manufacturing of a semiconductor device having a triple well structure, increasing productivity and effectively controlling the electrical characteristic of respective MOSFETs of a triple well structure.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a semiconductor device, comprising the steps of:

defining a cell region for an NMOS element and a peripheral circuit region for NMOS and PMOS elements on a semiconductor substrate;

forming a sacrifice oxide film and an ion barrier oxide film on the entire structure after the defining process;

performing ion injection process on the cell region and the peripheral circuit region, thereby forming a low concentration impurity injection region therein;

removing said ion barrier oxide film formed on the cell region and the peripheral circuit region;

performing ion injection process on selected regions of the cell region and the peripheral circuit region;

injecting ions for adjusting a threshold voltage into selected regions of the cell region and the peripheral circuit region;

performing ion injection process on said low concentration impurity regions of the cell region and the peripheral circuit region, thereby to form a R-well region and a P-well region, respectively;

removing said ion barrier oxide film on the peripheral circuit region; and performing ion injection process for adjusting the threshold voltage on the cell region and the peripheral circuit region.

2. The method of manufacturing a semiconductor device as claimed in claim 1, wherein said ion barrier oxide film is made of one of an undoped silicate glass and a phosphorus silicate glass.

3. The method of manufacturing a semiconductor device as claimed in claim 1, wherein said ion barrier oxide film on the peripheral circuit region in which said PMOS will be formed, is removed simultaneously with the photosensitive film pattern formed on the peripheral circuit region in which said NMOS will be formed, thus forming a low concentration impurity injection region at the cell region in which said NMOS will be formed and the peripheral circuit region in which the PMOS will be formed.

4. The method of manufacturing a semiconductor device as claimed in claim 1, wherein said ion barrier oxide film on the peripheral circuit region in which said NMOS will be formed, is removed simultaneously with the photosensitive film pattern formed on the selected regions of the cell region in which said NMOS will be formed and on the peripheral circuit region in which said NMOS will be formed, so that a R-well and a P-well can be formed at the selected regions of the cell region in which said NMOS will be formed and the peripheral circuit region in which said NMOS will be formed, respectively, by ion injection process.

5. A method of manufacturing a semiconductor device, comprising the steps of:

defining a cell region in which an NMOS will be formed, a first peripheral circuit region in which an NMOS will be formed an da second peripheral circuit region in which a PMOS will be formed and then forming an ion barrier oxide film;

forming a first photosensitive film pattern on said first peripheral circuit region, injecting low concentration N-type impurity ions with a high energy thereby to form low concentration N-type impurity injection regions on said cell region and said second peripheral circuit region, respectively;

removing said firs photosensitive film patterns, so that some of said ion barrier oxide films bombed with said N-type impurity ions are removed to remain only at said first peripheral circuit region;

after forming a second photosensitive film pattern on some of said cell region and on said first peripheral circuit region, injecting N-type impurity ions to form N-well regions on the other of a said cell region and on said second peripheral circuit region, respectively, and then injecting P-channel threshold voltage adjustment ions to form a P-channel on said second peripheral circuit region;

after removing said second photosensitive film patterns, forming a third photosensitive film pattern through which said some of said cell region and said first peripheral circuit region are opened, injecting P-type impurity ions to form a R-well surrounded by said N-well region at said cell region and a P-well at a P-well, respectively, and then injecting first N-channel threshold voltage adjustment ions to form said R-well and N-channel regions; and after removing said ion barrier oxide film remained on said first peripheral circuit region, injecting second N-channel threshold voltage adjustment ions into it, thereby to form a N-channel region at said first peripheral circuit region and to form a high concentration N-channel region at said R-well.

6. A method of manufacturing a semiconductor device having an NMOS cell area, an NMOS peripheral circuit area and a PMOS peripheral circuit area, the method comprising the steps of:

providing a substrate and defining first, second and third regions thereon, wherein the first region ultimately is associated with the NMOS cell area, the second region ultimately is associated with the NMOS peripheral circuit area, and the third region ultimately is associated with the PMOS peripheral circuit area;

forming a sacrificial oxide film on at least the first, second and third regions;

depositing anion barrier oxide film on top of the sacrificial oxide film;

performing a first ion injection process into the first region and also the third region, to thereby form low concentration impurity implantation regions therein;

removing at least the ion barrier oxide film from the first and third regions, while leaving the ion barrier oxide film on the second region;

performing a second ion injection process into a first portion of the first region and also into the third region, to thereby form high concentration impurity implantation regions in said first portion of the first region and also the third region;

performing a third ion injection process into a second portion of the first region and also into the second region to thereby form a first well in the second portion of the first region and a second well in the second region;

removing at least the ion barrier oxide film for the second region;

performing a fourth ion injection process into the second portion of the first region and also into the second region.

7. The method according to claim 6, further comprising the step of:

after performing the third ion injection process and before removing the ion barrier oxide film from the second region, injecting additional ions into the first and second regions such that the additional ions are injected into the first well, but not into the second well.

8. The method according to claim 7, wherein the additional ions are injected into the second portion of the first region, but not into the first portion of the first region.

9. The method according to claim 6, wherein the first well is an R-well which is formed in the second portion of the first region, and the second well is a P-well.

10. The method according to claim 6, wherein the first region and the third region are spaced apart from one another, and the second region is between the first and third regions.

11. The method according to claim 6, wherein said ion barrier oxide film is made of one of an undoped silicate glass and a phosphorus silicate glass.

12. The method according to claim 6, wherein the step removing at least the ion barrier oxide film from the second region comprises over-etching the ion barrier oxide film such that at least a portion of a film pattern overlying the first portion of the first region and also the third region, is removed.

13. The method according to claim 6, wherein a film pattern present on the second region is removed at the same time that the ion barrier oxide film is removed from the third region.

14. A method of manufacturing a semiconductor device, comprising the steps of:

defining a cell region for an NMOS element and a peripheral circuit region for NMOS and PMOS elements on a semiconductor substrate;

forming a sacrificial oxide film and an ion barrier oxide film on the entire structure after the defining step;

performing ion injection process on the cell region and the peripheral circuit region for the PMOS element, thereby forming a low concentration impurity injection therein;

removing said sacrificial oxide film and said ion barrier oxide film formed on the cell region and the peripheral circuit region for said PMOS element so that a portion of said sacrificial oxide film and said ion barrier oxide film remains on the peripheral circuit region for said NMOS element;

performing ion injection process on selected regions of the cell region and the peripheral circuit region;

injecting ions into selected regions of the cell region and the peripheral circuit region to thereby adjust a threshold voltage;

performing ion injection process on said low concentration impurity regions of the cell region and the peripheral circuit region, to thereby form an R-well region and a P-well region, respectively;

removing the remaining sacrificial oxide film and ion barrier oxide film on the peripheral circuit region; and performing ion injection process for adjusting the threshold voltage on the cell region and the peripheral circuit region.

* * * * *